(12) United States Patent
Hsu et al.

(10) Patent No.: US 6,815,307 B1
(45) Date of Patent: Nov. 9, 2004

(54) METHOD FOR FABRICATING A DEEP TRENCH CAPACITOR

(75) Inventors: Ping Hsu, Taipei Hsien (TW); Tzu-Ching Tsai, Tao-Yuan Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/605,217

(22) Filed: Sep. 16, 2003

(51) Int. Cl.$^7$ .............................................. H01L 21/20
(52) U.S. Cl. ........................ 438/386; 438/387; 438/389
(58) Field of Search ................................ 438/386, 387, 438/389

(56) References Cited

U.S. PATENT DOCUMENTS

| | | | | |
|---|---|---|---|---|
| 5,198,386 A | * | 3/1993 | Gonzalez ...................... | 438/253 |
| 6,225,158 B1 | * | 5/2001 | Furukawa et al. ........... | 438/243 |
| 6,391,706 B2 | * | 5/2002 | Wu et al. ..................... | 438/243 |
| 6,436,760 B1 | * | 8/2002 | Wong et al. ................. | 438/243 |
| 6,472,702 B1 | * | 10/2002 | Shen ........................... | 257/301 |

* cited by examiner

*Primary Examiner*—Michael Trinh
*Assistant Examiner*—Pamela E Perkins
(74) *Attorney, Agent, or Firm*—Winston Hsu (57) ABSTRACT

This invention pertains to a method for making a trench capacitor of DRAM devices. A portion of the collar oxide layer is masked after the second polysilicon deposition and recess etching process. Subsequently, the un-masked collar oxide layer is etched away to form an asymmetric collar oxide structure. The third polysilicon deposition and recess etching process is then carried out to form a third polysilicon stud atop the second polysilicon layer. The asymmetric collar oxide structure has a lower annular portion wrapping the second polysilicon layer and insulating the second polysilicon layer from the substrate, and an upper portion serving as a single-sided spacer for blocking diffusion of dopants from the third polysilicon stud to the substrate.

9 Claims, 12 Drawing Sheets

METHOD FOR FABRICATING A DEEP TRENCH CAPACITOR

BACKGROUND OF INVENTION

1. Field of the Invention

The present invention relates to a semiconductor process, and more particularly, to a process of manufacturing a deep trench capacitor of a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

In general, the prior art method for fabricating a trench capacitor of a DRAM device may include several major manufacture phases as follows:

Phase 1: deep trench etching.

Phase 2: buried plate and capacitor dielectric (or node dielectric) forming.

Phase 3: first polysilicon deep trench fill and first recess etching.

Phase 4: collar oxide forming.

Phase 5: second polysilicon deposition and second recess etching.

Phase 6: third polysilicon deposition and third recess etching.

Phase 7: shallow trench isolation (hereinafter referred to as "STI") forming.

Figure 1:
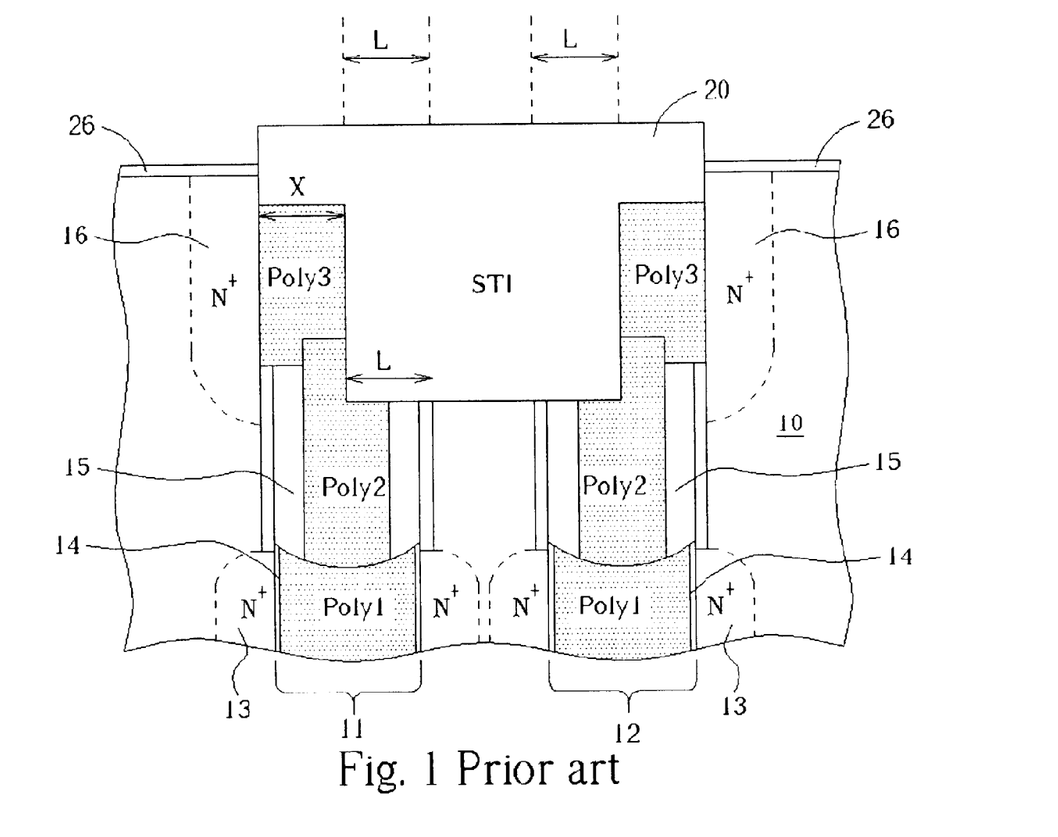
FIG. 1 is a schematic diagram illustrating an enlarged portion of a typical deep trench capacitor in cross-sectional view along line NN' of FIG. 2.
Figure 2:
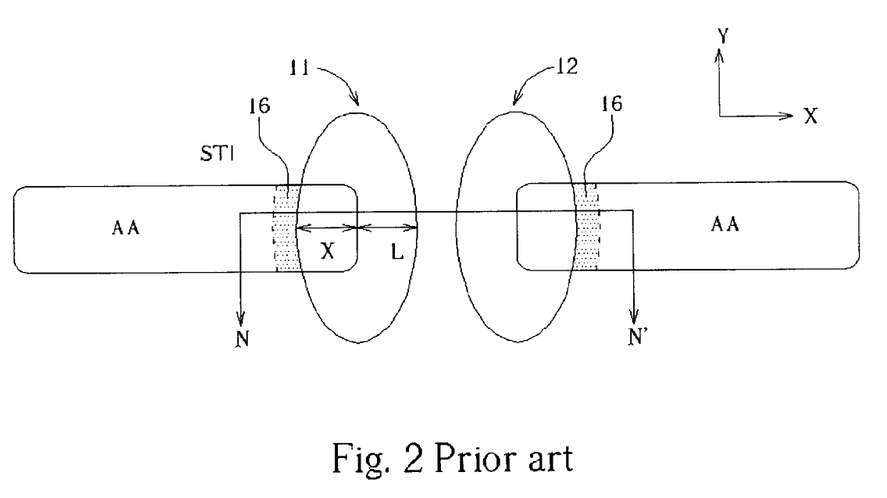
FIG. 2 shows the normal AA and DT layout without DT-AA misalignment after accomplishing STI process, wherein perspective buried strap out diffusion 16 is shown.
Figure 3:
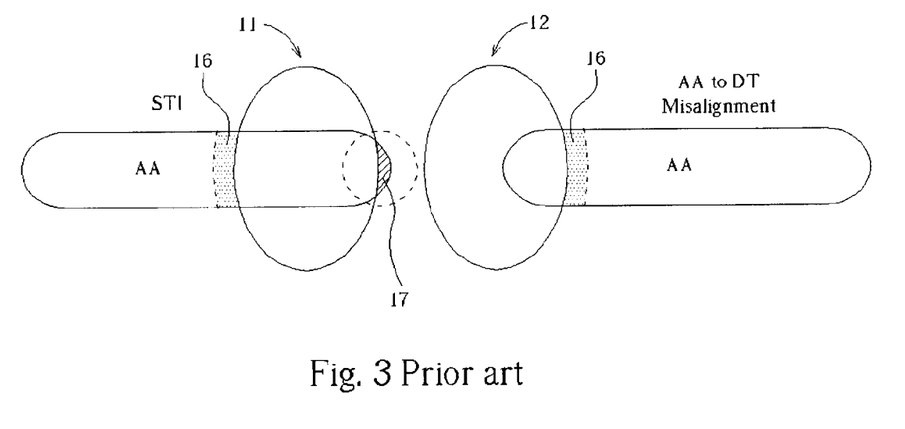
FIG. 3 depicts misaligned AA and DT layout after accomplishing STI process, wherein perspective buried strap out diffusion 16 and excess conductive diffusion 17 are shown.

Please refer to FIG. 1 to FIG. 3. FIG. 1 is a schematic diagram illustrating an enlarged portion of a typical deep trench capacitor in cross-sectional view along line NN' of FIG. 2.

FIG. 2 shows the normal layout of the active areas (hereinafter referred to as "AA") and deep trench capacitors (hereinafter also referred to as "DT") 11 and 12 without DT-AA misalignment after accomplishing STI process, wherein perspective buried strap out diffusion 16 is shown. FIG. 3 depicts misaligned AA and DT layout after accomplishing STI process. Referring initially to FIG. 1, two adjacent deep trench capacitors (DT) 11 and 12 are fabricated in a semiconductor substrate 10, wherein each of which is comprised of a buried plate 13, node dielectric 14, poly stack storage node (Poly1/Poly2/Poly3). As known to those skilled in the art, the buried plate 13 acts as a first electrode of the deep trench capacitor, and the poly stack storage node (Poly1/Poly2/Poly3), which is electrically isolated from the buried plate 13 by the node dielectric 14, acts as a second electrode of the deep trench capacitor. Typically, the second polysilicon layer (Poly2) of the poly stack storage node (Poly1/Poly2/Poly3) is electrically from the surrounding substrate 10 by a socalled collar oxide 15. The deep trench capacitors 11 and 12 are electrically connected to respective access transistors (not shown), which are formed on the active areas 26, via the buried strap out diffusions 16. The deep trench capacitor 11 is electrically isolated from the deep trench capacitor 12 by the STI 20.

As the size of a memory cell shrinks, the chip area available for a single memory cell becomes very small. This causes reduction in capacitor area on a single chip and therefore leads to problems such as inadequate capacitance and large electrode resistance. In FIG. 1, two essential parameters are defined: X and L, wherein the parameter "X" stands for the maximum distance in the overlapping region between AA and DT in the x-direction, and the parameter "L" stands for the maximum distance of the DT in the x-direction subtracts the parameter "X". In other words, the maximum width of the DT in the x-direction is the combination of the parameters "X" and "L". It is often desired that to minimize the electrode resistance, the parameter "L" is kept as small as possible, while the parameter "X" is kept as large as possible. Larger "X" means longer AA region, and smaller "L" means narrower STI between two adjacent deep trench capacitors. Referring to FIG. 3, unfortunately, small "L" often leads to AA-DT misalignment when defining AA and STI areas, and therefore causes capacitor charge leakage via diffusion region 17 as shown in dash line circle. When AA-DT misalignment occurs, the conductive diffusion region 17 is formed in the area between two adjacent deep trench capacitors 11 and 12, in which a STI is supposed to embedded therein for isolating the two adjacent deep trench capacitors 11 and 12.

Figure 4:
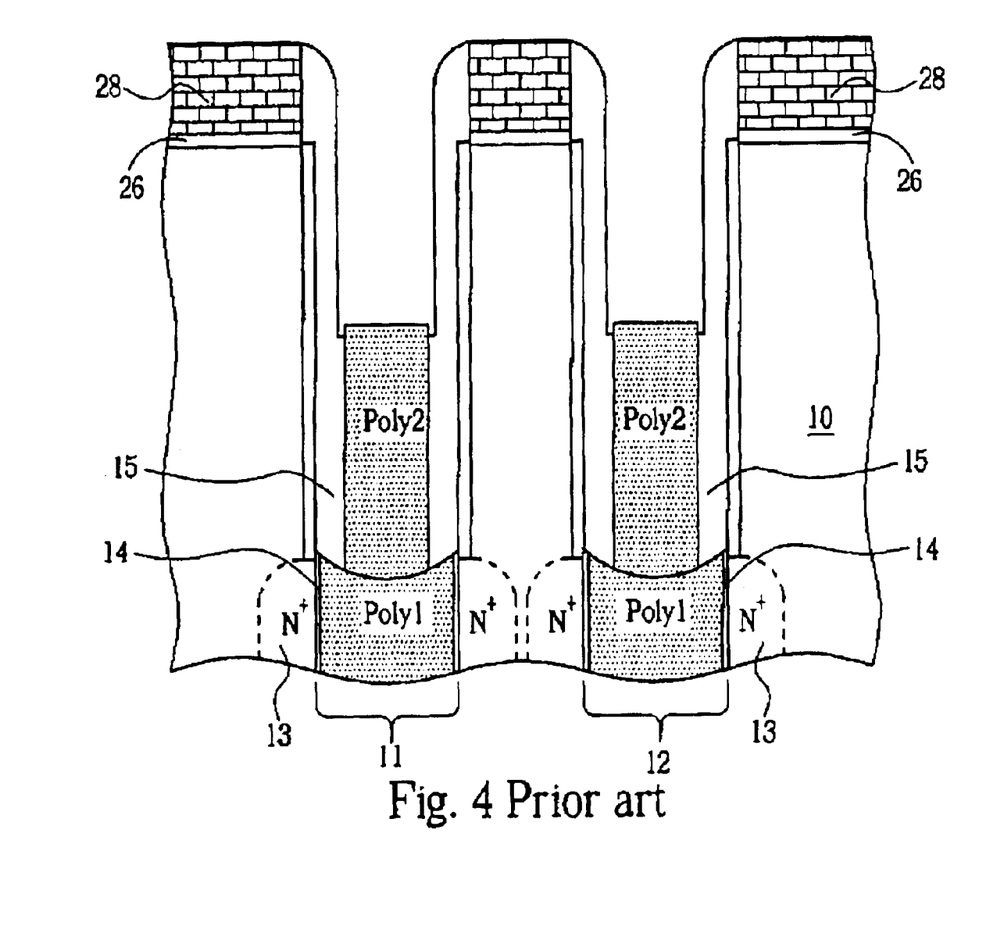
FIG. 4 and FIG. 5 are schematic cross-sectional diagrams showing several intermediate steps of forming a prior art deep trench capacitor.
Figure 5:
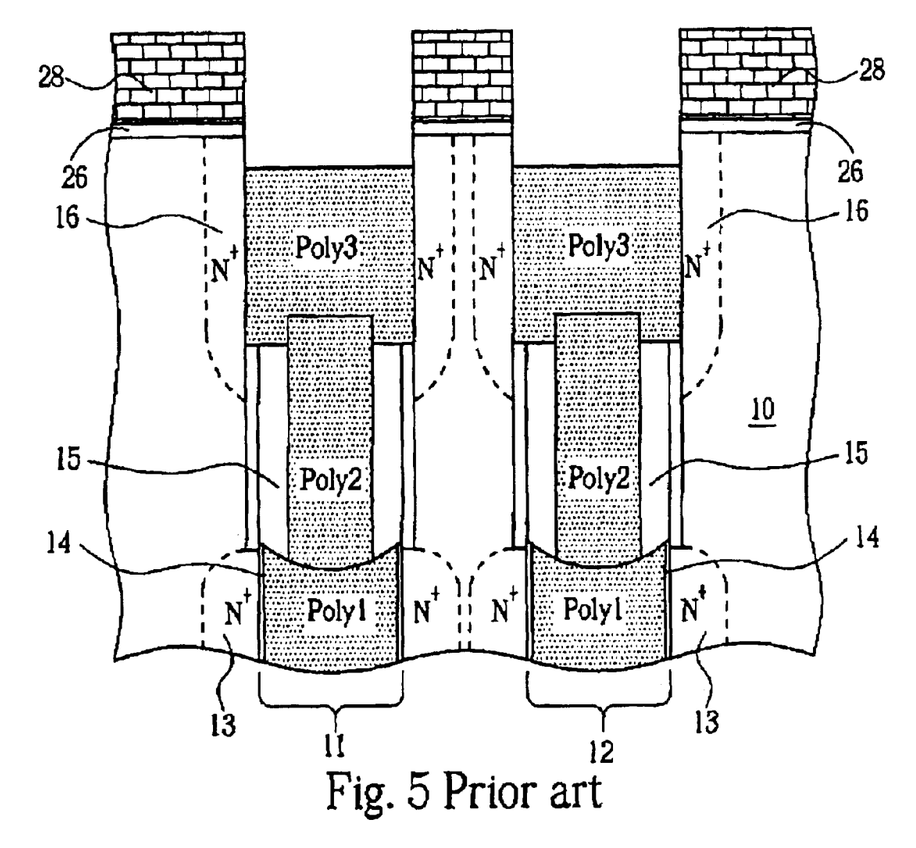

Please refer to FIG. 4 and FIG. 5. FIG. 4 and FIG. 5 are schematic cross-sectional diagrams showing several intermediate steps of forming a prior art deep trench capacitor, which are relative to the present invention. As shown in FIG. 4, a substrate 10 having a pad oxide layer 26 and a pad nitride layer 28 thereon is provided. After deep trench etching, an $N^+$ buried plate 13 and a node dielectric layer 14 are sequentially formed in the deep trench. A first polysilicon deposition and recess process is then carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atop Poly1. As shown in FIG. 5, the collar oxide layer 15 that is not covered by Poly 2 is stripped off to expose the sidewall of the deep trench. Subsequently, a third polysilicon deposition and recess process is carried out to form a third poly layer (Poly3) atop Poly2. Dopants of the heavily doped Poly2 diffuse out through Poly3 to the surrounding substrate 10 to form an annular shaped buried strap out diffusion 16. Finally, a conventional STI process is performed to isolate the two adjacent deep trench capacitors, thereby forming the structure as set forth in FIG. 1.

SUMMARY OF INVENTION

The primary objective of the present invention is to provide a novel method for fabricating a trench capacitor of DRAM devices, thereby solving prior art AA-DT misalignment problem during STI process and reducing resistance of the capacitor electrode.

According to the claimed invention, a method for fabricating a trench capacitor is disclosed. A substrate having thereon a pad oxide layer and a pad nitride layer is provided. A deep trench is formed by etching the pad nitride layer, the pad oxide layer, and the substrate. The deep trench is then doped to form a buried diffusion plate in the substrate at a lower portion of the deep trench. A node dielectric layer is deposited in the deep trench. A first polysilicon deposition and recess etching is performed to embed a first polysilicon layer on the node dielectric layer at the lower portion of the deep trench, and the first polysilicon layer having a top surface, wherein the d top surface of the first polysilicon layer and sidewall of the deep trench define a first recess. A collar oxide layer is formed on sidewall of the first recess. A second polysilicon deposition and recess etching is performed to embed a second polysilicon layer on the first polysilicon layer. A mask layer is form to partially mask the collar oxide layer. The collar oxide layer that is not masked by the mask layer and the second polysilicon (Poly2) layer is then stripped off. The mask layer is removed. A third polysilicon deposition and recess etching is then carried out to embed a third polysilicon (Poly3) layer on the second polysilicon (Poly2) layer.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 6:
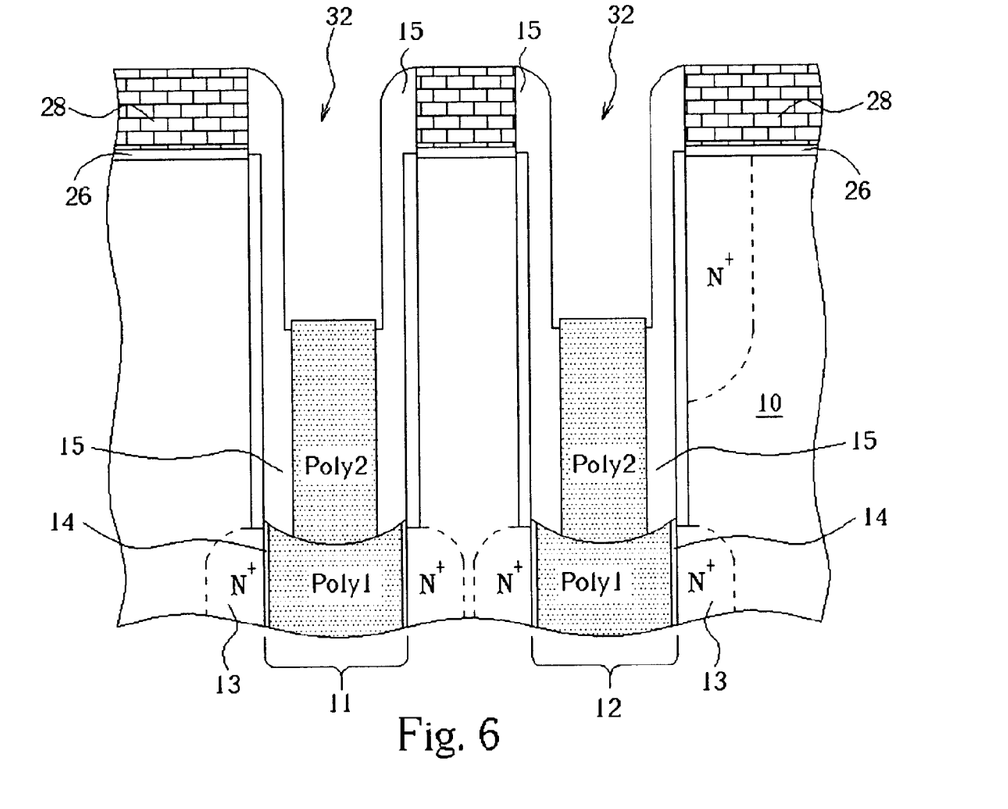
FIG. 6 to FIG. 9 are schematic cross-sectional diagrams showing the manufacture steps of making a deep trench capacitor in accordance with the first preferred embodiment of the present invention.

Please refer to FIG. 6 to FIG. 9. FIG. 6 to FIG. 9 are schematic cross-sectional diagrams showing the manufacture steps of making a deep trench capacitor in accordance with the first preferred embodiment of the present invention, in which like reference numerals designate similar or corresponding elements, regions, and portions. As shown in FIG. 6, a semiconductor substrate 10 such as a silicon substrate is provided. A pad oxide layer 26 and a pad nitride layer 28 are formed on a main surface of the semiconductor substrate 10. A dry etching process is carried out to form a deep trench in the semiconductor substrate 10. A buried plate 13 adjacent to the deep trench and a node dielectric layer 14 are formed. A first polysilicon deposition and recess process is carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atop Poly1. The method of forming the buried plate 13 comprises the steps of depositing a thin layer of arsenic silicate glass (ASG) at a lower portion of the deep trench, followed by thermal drive in. It is understood that other doping methods such as gas phase doping (GPD) or the like may be employed. The node dielectric layer 14 may be oxide-nitride (ON) or oxide-nitride-oxide (ONO), but not limited thereto. After performing the second polysilicon deposition and recess process, the top surface of Poly2 and the surface of the collar oxide layer 15 define a recess 32 at the top of the deep trench.

Figure 7:
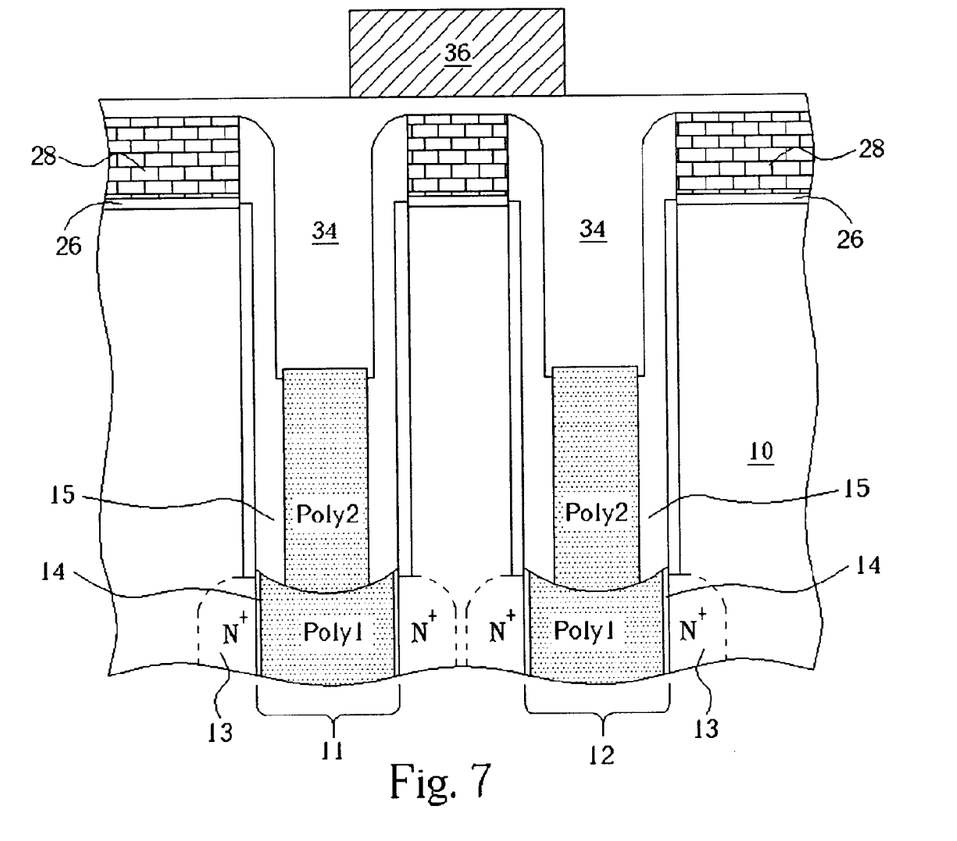

As shown in FIG. 7, the recess 32 is filled with a sacrificial layer 34. The sacrificial layer 34 is also deposited on the pad nitride layer 28. According to the preferred embodiment of this invention, the sacrificial layer 34 is an anti-reflection coating (ARC) material typically used in semiconductor processes. Thereafter, a lithographic process is carried out to form a photoresist layer 36 on the sacrificial layer 34. The photoresist layer 36 partially masks the underlying sacrificial layer 34 that is deposited within the recess 32 and partially overlaps with the collar oxide layer 15.

Figure 8:
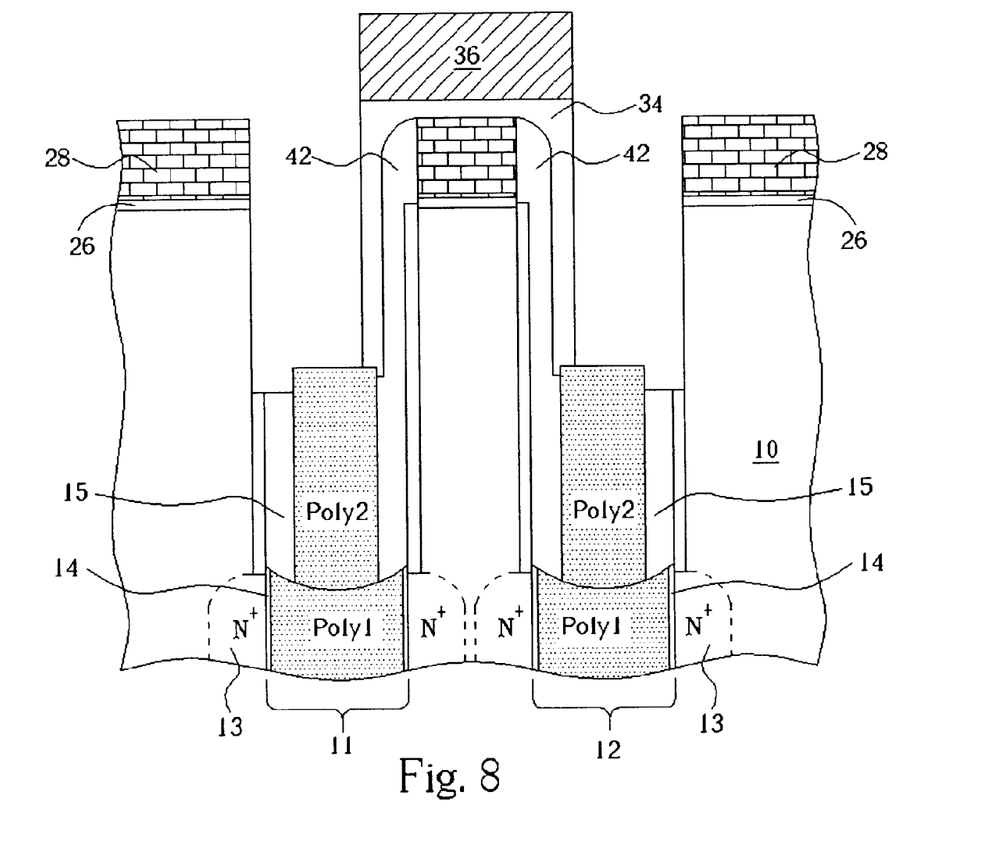

As shown in FIG. 8, using the photoresist layer 36 and the pad nitride layer 28 as an etching mask, an anisotropic dry etching process is performed to etch the sacrificial layer 34 and the collar oxide layer 15 that are not covered by the photoresist layer 36. Asymmetric collar oxide structure is thus formed. A portion of the collar oxide layer 15, which is protected by the photoresist layer 36 during the dry etching, remains intact and forms a single-sided spacer 42 in the recess 32. The collar oxide layer 15 that is not protected by the photoresist layer 36 is etched away to a surface that is lower than the exposed top surface of Poly2. As seen in FIG. 8, the asymmetric collar oxide structure includes an annular lower portion, which encircles Poly2 and isolates Poly2 from the substrate 10, and the upper portion, i.e., the single-sided spacer 42, which blocks the path through which dopants of Poly2 out diffuse, via a Poly3 layer (not yet formed at this stage) atop the Poly2, to the substrate 10. Next, the photoresist layer 36 and the sacrificial layer 34 are removed by methods known in the art, thereby forming a recess 57, which is substantially defined by the surface of the single-sided spacer 42, the top surface of Poly2, and the exposed sidewall substrate 10 above the collar oxide layer 15.

Figure 9:
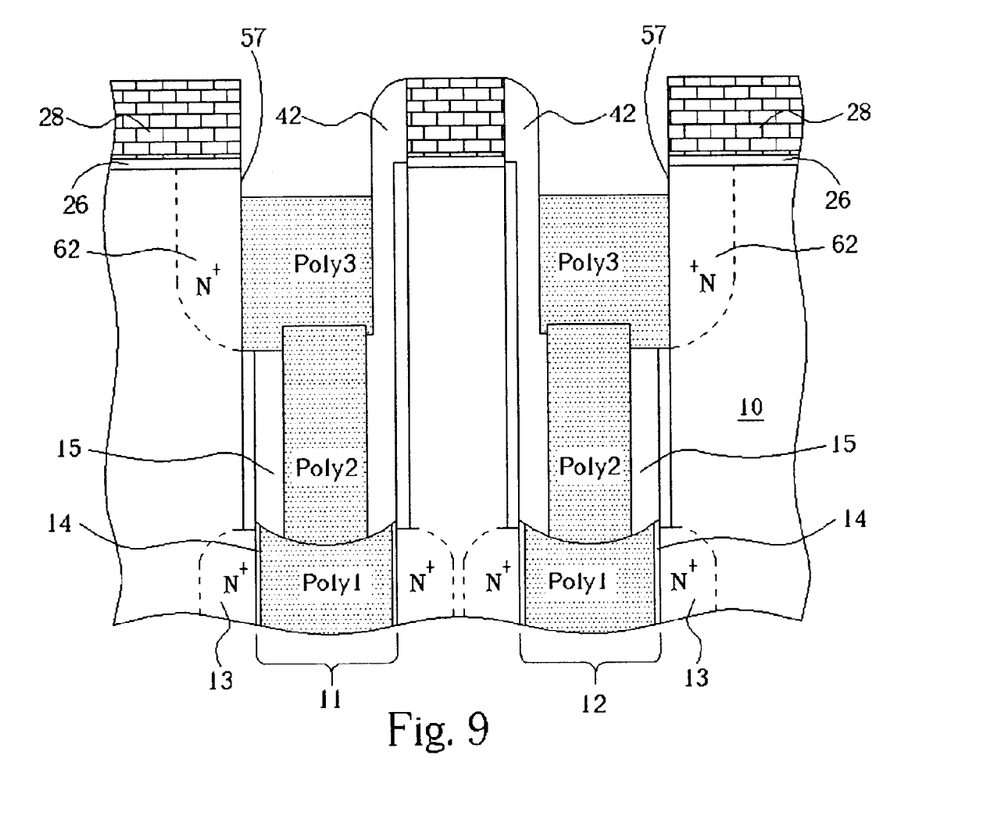

As shown in FIG. 9, a third polysilicon deposition and recess etching process is carried out to form a third polysilicon layer (Poly3) atop Poly2. First, a CVD polysilicon layer (not shown) is deposited over the substrate 10 and fills the recess opening 57. The CVD polysilicon layer is then recessed to a predetermined depth, for example, a depth of about 100~500 angstroms below the surface of the semiconductor substrate 10. It is to be understood that the surface of the semiconductor substrate 10 means the interface between the pad oxide layer 26 and the bulk substrate 10. Dopants of the heavily doped Poly2 diffuse out through Poly3 to the surrounding substrate 10 that is not masked by the single-sided spacer 42 to form a non-annular buried strap out diffusion 62, which connects a source region of an access transistor (not shown and not yet formed at this stage) with the storage node of the trench capacitor. Finally, an STI process, which is known in the art, is carried out. By way of example, a borosilicate glass (BSG) layer is deposited over the substrate 10 and fills the recess opening above Poly3 in the trench. An AA photoresist is formed on the BSG layer to define the active areas. The AA photoresist has therein an STI opening defining the STI region to be etched into the substrate 10.

Figure 10:
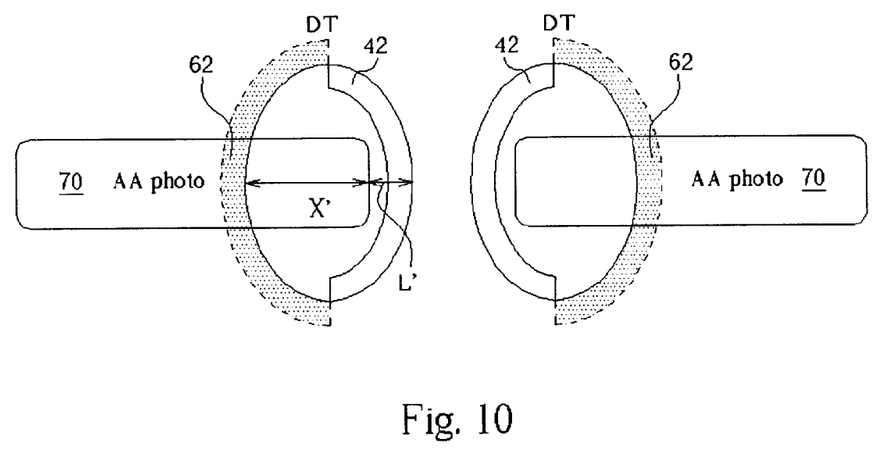
FIG. 10 is a top view of FIG. 9 in a state before STI etching process, wherein the perspective non-annular buried strap out diffusion and single-sided spacer are illustrated.

Please refer to FIG. 10. FIG. 10 is a top view of FIG. 9 in a state after forming AA photoresist 70 but before STI etching process, wherein the perspective non-annular buried strap out diffusion 62 and single-sided spacer 42 are illustrated. It is shown that due to the existence of the single-sided spacer 42, the STI opening width between two adjacent deep trenches can be very small without the fear of AA-DT misalignment. It is noted that smaller STI opening width between two adjacent deep trenches means longer active area pattern (defined by the AA photoresist 70), as shown in FIG. 10. Buried strap out diffusion 62 only forms through the sidewall that is not blocked by the single-sided spacer 42 that is situated adjacent to a neighboring deep trench capacitor. Therefore, there is substantially no out diffusion region between two adjacent trench capacitors. The extended M has a modified parameter. X' (the maximum distance in the overlapping region between AA and DT in the x-direction) that is larger than the prior art parameter X, and a modified parameter L' (the maximum distance of the DT in the x-direction subtracts the parameter X') that is smaller than the prior art parameter L.

Figure 11:
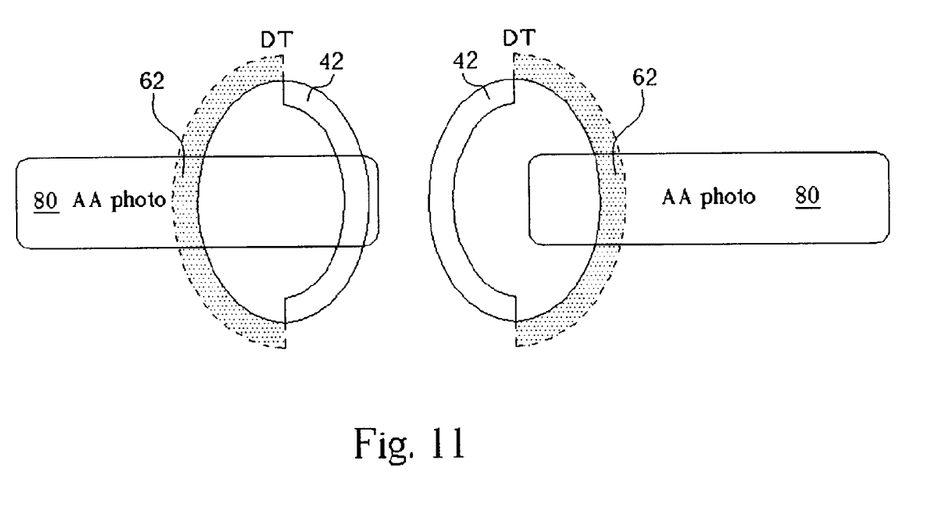
FIG. 11 is a top view layout in a DT-AA misaligned state before STI etching process in accordance with the second preferred embodiment of the present invention.

Please refer to FIG. 11. FIG. 11 is a top view layout in a DT-AA misaligned state after forming the AA photoresist 80 but before STI etching process in accordance with the second preferred embodiment of the present invention. As shown in FIG. 11, buried strap out diffusion 62 only forms through the sidewall that is not blocked by the single-sided spacer 42 that is situated adjacent to a neighboring deep trench capacitor. Therefore, there is substantially no out diffusion region between two adjacent trench capacitors. The process window during STI process is increased because the DT-AA misalignment is allowed.

Figure 12:
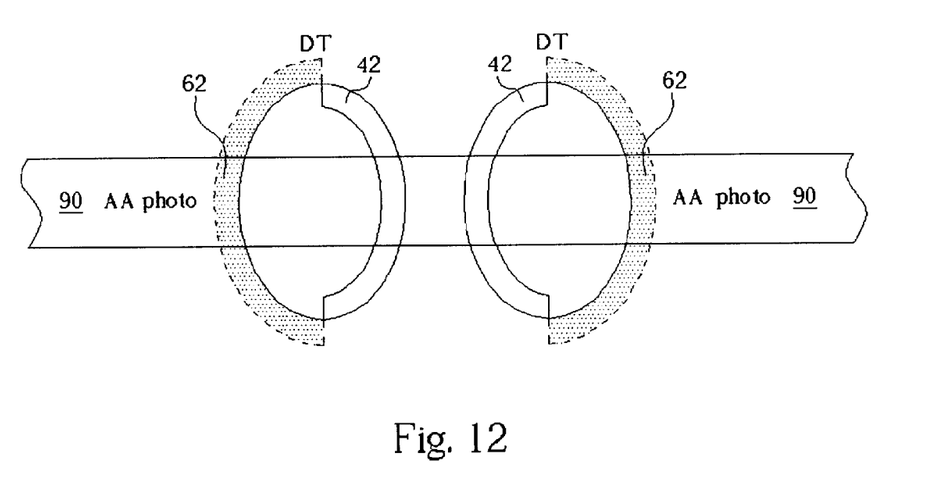
FIG. 12 is a top view layout before STI etching process in accordance with the third preferred embodiment of the present invention.

Please refer to FIG. 12. FIG. 12 is a top view layout after forming the AA photoresist 90 but before STI etching process in accordance with the third preferred embodiment of the present invention. As shown in FIG. 12, the AA photoresist 90 is a strap across two adjacent deep trenches. A portion of the single-sided spacer 42 that is masked by the AA photoresist 90 serves as isolation dielectric between two adjacent trench capacitors.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a trench capacitor, comprising:
   providing a substrate having thereon a pad layer;
   etching in order of said pad layer and said substrate to form a deep trench;
   doping said deep trench to form a buried diffusion plate in said substrate at a lower portion of said deep trench;
   lining said deep trench with a node dielectric layer;
   performing a first polysilicon deposition and recess etching to embed a first polysilicon (Poly1) layer on said node dielectric layer at said lower portion of said deep trench, and said first polysilicon (Poly1) layer having a top surface, wherein said top surface of said first polysilicon layer and sidewall of said deep trench define a first recess;
   forming a collar oxide layer on sidewall of said first recess;
   performing a second polysilicon deposition and recess etching to embed a second polysilicon (Poly2) layer on said first polysilicon (Poly1) layer;
   forming a mask layer partially masking said collar oxide layer;
   removing said collar oxide layer not masked by said mask layer and said second polysilicon (Poly2) layer;
   removing said mask layer; and
   performing a third polysilicon deposition and recess etching to embed a third polysilicon (Poly3) layer on said second polysilicon (Poly2) layer.

2. The method of claim 1 wherein said substrate is a silicon substrate.

3. The method of claim 1 wherein said deep trench has a depth that is larger than 6 microns below a surface of said substrate.

4. The method of claim 1 wherein doping said deep trench to form a buried diffusion plate in said substrate involves the use of an arsenic silicate glass (ASG) film.

5. The method of claim 1 wherein said node dielectric is an oxide-nitride-oxide (ONO) dielectric layer.

6. The method of claim 1 wherein said mask layer comprises a photoresist layer.

7. The method of claim 6 wherein said mask layer further comprises a sacrificial layer underlying said photoresist layer.

8. The method of claim 7 wherein said sacrificial layer is made of anti-reflection coating materials.

9. The method of claim 1 wherein the step of removing said collar oxide layer not masked by said mask layer and said second Poly2 layer leaves a portion of said collar oxide on sidewall of said first recess to form a single-sided spacer.

* * * * *